United States Patent
Ivanov et al.

(10) Patent No.: US 10,100,272 B2
(45) Date of Patent: Oct. 16, 2018

(54) CLEANING COMPOSITION FOLLOWING CMP AND METHODS RELATED THERETO

(71) Applicant: Cabot Microelectronics Corporation, Aurora, IL (US)

(72) Inventors: Roman Ivanov, Aurora, IL (US); Cheng-yuan Ko, New Taipei (TW); Fred Sun, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/327,326

(22) PCT Filed: Jul. 17, 2015

(86) PCT No.: PCT/US2015/040873
§ 371 (c)(1),
(2) Date: Jan. 18, 2017

(87) PCT Pub. No.: WO2016/011331
PCT Pub. Date: Jan. 21, 2016

(65) Prior Publication Data
US 2017/0158992 A1     Jun. 8, 2017

Related U.S. Application Data

(60) Provisional application No. 62/026,069, filed on Jul. 18, 2014.

(51) Int. Cl.
*C11D 7/32* (2006.01)
*C11D 11/00* (2006.01)
(Continued)

(52) U.S. Cl.
CPC .......... *C11D 11/0047* (2013.01); *C11D 7/265* (2013.01); *C11D 7/267* (2013.01);
(Continued)

(58) Field of Classification Search
CPC .... C11D 7/26; C11D 1/00; C11D 1/66; C11D 7/32; H01L 21/304
(Continued)

(56) References Cited

U.S. PATENT DOCUMENTS 5,209,858 A   5/1993   Heinsohn et al.
7,825,079 B2  11/2010  Suzuki et al.
(Continued)

FOREIGN PATENT DOCUMENTS

WO        0140425 A2     6/2001

OTHER PUBLICATIONS

Korean Intellectual Property Office, International Search Report issued in connection with Application No. PCT/US2015/040871 dated Oct. 22, 2015.
(Continued)

*Primary Examiner* — Gregory Webb
(74) *Attorney, Agent, or Firm* — Thomas Omholt; Erika S. Wilson; Salim A. Hasan

(57) ABSTRACT

The invention provides a composition for cleaning contaminants from semiconductor wafers following chemical-mechanical polishing. The cleaning composition contains a bulky protecting ligand, an organic amine, an organic inhibitor, and water. The invention also provides methods for using the cleaning composition.

28 Claims, 2 Drawing Sheets

(51) Int. Cl.
    *C11D 7/36* (2006.01)
    *C11D 7/26* (2006.01)
    *H01L 21/02* (2006.01)
    *H01L 21/321* (2006.01)
    *H01L 21/768* (2006.01)

(52) U.S. Cl.
    CPC .............. *C11D 7/32* (2013.01); *C11D 7/3209* (2013.01); *C11D 7/3218* (2013.01); *C11D 7/3245* (2013.01); *C11D 7/3272* (2013.01); *C11D 7/36* (2013.01); *H01L 21/02074* (2013.01); *H01L 21/3212* (2013.01); *H01L 21/7684* (2013.01)

(58) Field of Classification Search
    USPC .......................................................... 510/175
    See application file for complete search history.

(56) References Cited

U.S. PATENT DOCUMENTS

| | | |
|---|---|---|
| 7,919,446 B1 | 4/2011 | Fresco et al. |
| 2008/0076688 A1 | 3/2008 | Barnes et al. |
| 2009/0133716 A1 | 5/2009 | Lee |
| 2009/0162537 A1 | 6/2009 | Kolics et al. |
| 2009/0203566 A1* | 8/2009 | Lee ............... G03F 7/425 510/175 |
| 2009/0281017 A1 | 11/2009 | Suzuki et al. |
| 2010/0043823 A1 | 2/2010 | Lee |
| 2013/0323410 A1* | 12/2013 | Kolics ............. C11D 7/3209 427/99.2 |
| 2014/0076365 A1 | 3/2014 | Otake et al. |

OTHER PUBLICATIONS

Korean Intellectual Property Office, International Search Report issued in connection with Application No. PCT/US2015/040873 dated Nov. 30, 2015.
European Patent Office, Supplementary European Search Report issued in connection with Patent Application No. 15822685 dated Feb. 23, 2018.

* cited by examiner

US 10,100,272 B2

CLEANING COMPOSITION FOLLOWING CMP AND METHODS RELATED THERETO

BACKGROUND OF THE INVENTION

A semiconductor wafer is typically composed of a substrate, such as a silicon wafer, on which a plurality of transistors have been formed. Transistors are chemically and physically connected into a substrate and are interconnected through the use of well known multilevel coplanar interconnects to form functional circuits. Typical multilevel interconnects are comprised of stacked thin-films consisting of, for example, one or more of the following: titanium (Ti), titanium nitrate (TiN), copper (Cu), aluminum (Al), tungsten (W), tantalum (Ta), or any combination thereof.

The traditional technique for forming functional multilevel coplanar interconnects has involved planarizing the surface of the interconnects via chemical-mechanical polishing (CMP). CMP involves the concurrent chemical and mechanical polishing of an overlying first layer to expose the surface of a non-planar second layer on which the first layer has been formed (see, e.g., U.S. Pat. Nos. 4,671,851; 4,910,155; 4,944,836; 6,592,776; 7,524,347; and 8,518,135).

CMP processes typically involve a polishing composition (also referred to as a polishing slurry) that contains abrasive particles, such as silica or alumina, in an acidic or basic solution. In a typical CMP process, a wafer is mounted upside down on a carrier in a CMP tool. A force pushes the carrier and the wafer downward toward a polishing pad. The carrier and the wafer are rotated above the rotating polishing pad on the CMP tool's polishing table. The polishing composition is then introduced between the rotating wafer and the rotating polishing pad during the polishing process.

Although conventional CMP processes are suitable for polishing, they tend to leave undesirable contaminants on the wafer surface. In particular, the nonmetal substrate (e.g., silicon dioxide) of the polished wafer is often contaminated with remnants of the polishing composition, such as silica or alumina abrasive particles, and with metal ions from the polishing composition and from the material being polished. Such contaminants can have an adverse effect on semiconductor wafer performance. As a result, after a polishing composition is applied to the semiconductor surface, the polishing composition typically is washed from the wafer surface with an aqueous cleaning solution after CMP is completed (see, e.g., U.S. Pat. Nos. 4,051,057; 5,334,332; 5,837,662; 5,981,454; 6,395,693; and 6,541,434 and U.S. Patent Publication 2009/0130849).

Typical post-CMP cleaning compositions have not been fully satisfactory in cleaning semiconductor wafers. For example, it has been a challenge to obtain a cleaning solution that effects both low corrosion and good cleaning of material being polished. Accordingly, there remains a need in the art for a composition and/or method to effectively clean contaminants originating from the polishing composition, the polishing pad, and the material being polished from a semiconductor surface, while also minimizing corrosion. The invention seeks to provide such a semiconductor cleaning composition. These and other advantages of the invention will be apparent from the description of the invention provided herein.

BRIEF SUMMARY OF THE INVENTION

In one aspect, the invention provides a composition for cleaning contaminants from semiconductor wafers following chemical-mechanical polishing. The composition comprises, consists essentially of, or consists essentially of (a) one or more bulky protecting ligands selected from maleic acid, ethylenediaminetetraacetic acid (EDTA), nitriloacetic acid (NTA), hydroxyethane diphosphoric acid (HEDA), ethylenediaminetetramethylene phosphoric acid, amino tris(methylene phosphoric acid) (ATMP), hydroxyethyliminodiacetic acid (HIDA), diethylenetriaminepentaacetic acid (DPTA), cysteine (Cys), ascorbic acid (Asc), choline hydroxide, and quaternary ammonium hydroxide, (b) one or more organic amines, (c) one or more organic inhibitors, and (d) water. The organic amine is in an amount of from about 0.001 wt. % to about 5 wt. % based on the total weight of the composition, the weight ratio of the bulky protecting ligand(s) to the organic amine(s) is about 1:1 or higher, and the composition has a pH of from about 9 to about 13.

In another aspect, the invention provides a composition for cleaning contaminants from semiconductor wafers following chemical-mechanical polishing. The composition comprises, consists, or consists essentially of (a) one or more bulky protecting ligands selected from maleic acid, EDTA, NTA, HEDA, ethylenediaminetetramethylene phosphoric acid, ATMP, HIDA, DPTA, Cys, Asc, choline hydroxide, and quaternary ammonium hydroxide, (b) one or more organic amines, (c) one or more dual organic inhibitors comprising chelating reducing agent and oxygen scavenger, and (d) water. The composition has a pH of from about 9 to about 13.

In another aspect, the invention provides a cleaning method. The method comprises, consists of, or consists essentially of (a) providing a semiconductor wafer having contaminants resulting from chemical-mechanical polishing of the semiconductor wafer and (b) contacting the surface of the semiconductor wafer with a composition, as described herein, for cleaning contaminants from semiconductor wafers following chemical-mechanical polishing to remove at least some of the contaminants from the surface of the semiconductor wafer.

In another aspect, the invention provides a cleaning method. The method comprises, consists of, or consists essentially of (a) providing a semiconductor wafer having contaminants resulting from chemical-mechanical polishing of the semiconductor wafer and (b) contacting the surface of the semiconductor wafer with a composition, as described herein, for cleaning contaminants from semiconductor wafers following chemical-mechanical polishing to remove at least some of the contaminants from the surface of the semiconductor wafer.

In another aspect, the invention provides a method for polishing and cleaning the surface of a semiconductor wafer. The method comprises (a) providing a polishing pad, a chemical-mechanical polishing composition, and a semiconductor wafer; (b) contacting the semiconductor wafer with the polishing pad and the polishing composition; (c) moving the polishing pad relative to a surface of the semiconductor wafer with the polishing composition therebetween to abrade the surface of the semiconductor wafer and thereby polish the surface of the wafer such that the polished surface of the wafer contains contaminants from the chemical-mechanical polishing composition; and (d) contacting the polished surface of the semiconductor wafer that contains contaminants with a cleaning composition, as described herein, to remove at least some of the contaminants from the polished surface of the semiconductor wafer.

DETAILED DESCRIPTION OF THE INVENTION

Figure 1:
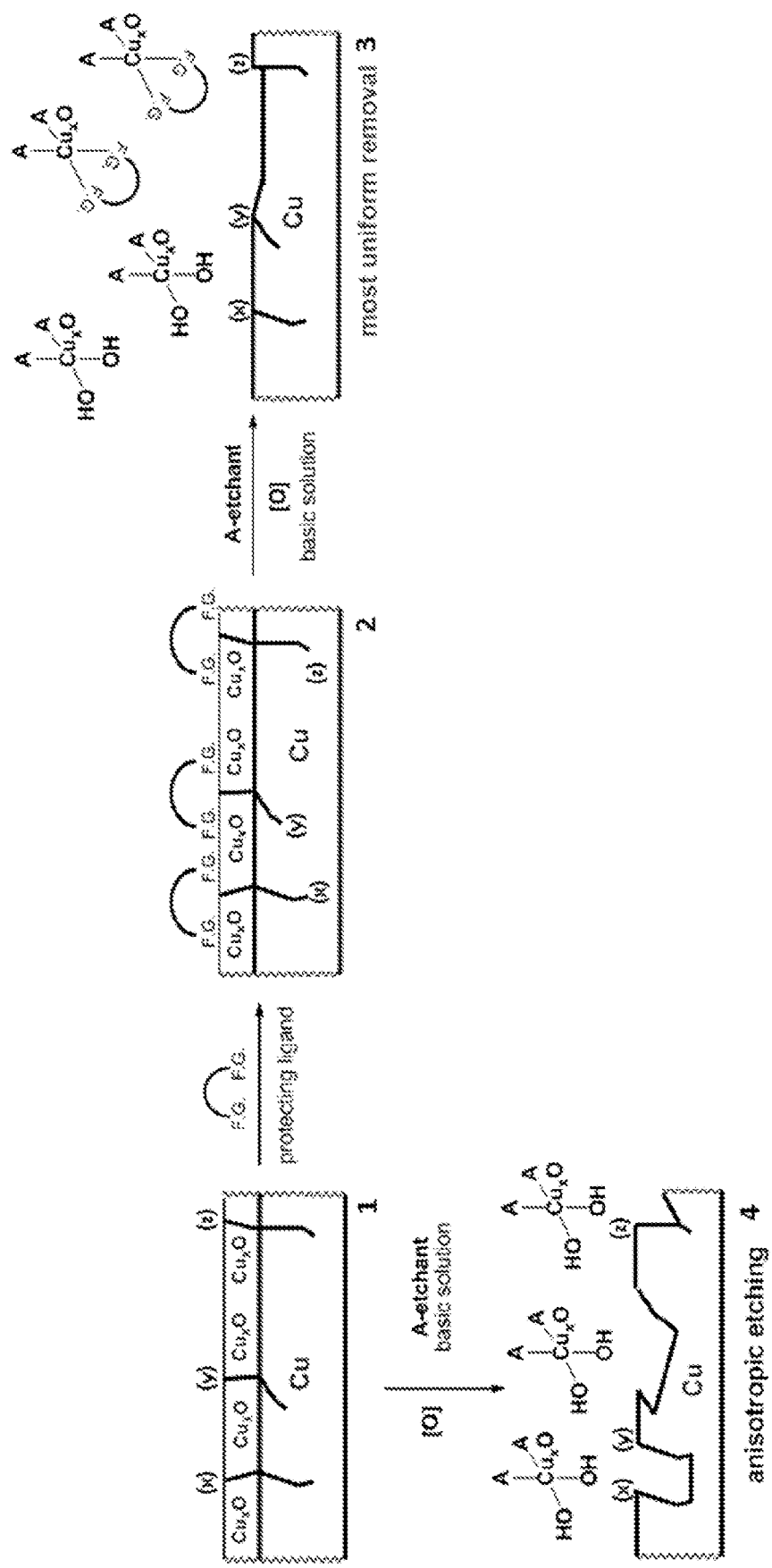
FIG. 1, while not wishing to be bound by any particular theory, is a schematic depiction believed to illustrate a mechanism in accordance with embodiments of the invention in comparison with a conventional cleaning system.

Embodiments of the invention provide a composition for cleaning contaminants from substrates, such as semiconductor wafers, following chemical-mechanical polishing. In particular, the cleaning composition of the invention can be used to remove some or all of the contaminants that result from chemical-mechanical polishing (CMP) systems as known in the art. For example, remnants from the polishing composition and process can result in debris that can be in the form of organic compounds, such as benzotriazole (BTA), silica, or other abrasive particles, surfactants, metal ions, polishing pad debris, CMP byproducts (e.g., metal adduct ions with organic ligands), or the like. These remnants and other contaminants are reduced in quantity or removed by use of the cleaning composition disclosed herein.

The composition comprises, consists of, or consists essentially of (a) one or more bulky protecting ligands, (b) one or more organic amines, (c) one or more organic inhibitors, and (d) water. The bulky protecting ligand is selected from maleic acid, ethylenediaminetetraacetic acid (EDTA), nitriloacetic acid (NTA), hydroxyethane diphosphoric acid (HEDA), ethylenediaminetetramethylene phosphoric acid, amino tris(methylene phosphoric acid) (ATMP), hydroxyethyliminodiacetic acid (HIDA), diethylenetriaminepentaacetic acid (DPTA), cysteine (Cys), ascorbic acid (Asc), choline hydroxide, and quaternary ammonium hydroxide.

Without desiring to be bound to any particular theory, the protecting ligand is generally bulky because of its relative volume, generally characterized by steric effects induced by these ligands, is generally labile because it can spontaneously dissociate out of metal ions or be replaced by other liable ligands, such as water molecules, and can protect by reacting with the most active sites on a metal surface. The organic amine can serve as an etchant to strip off CMP byproducts and metal oxides formed during the CMP process. The organic inhibitor serves to control metal oxidation during the post-CMP cleaning process.

In preferred embodiments, the weight ratio of the bulky protecting ligand(s) to the organic amine(s) is about 1:1 or higher. In some embodiments, the organic amine is in an amount from about 0.01 wt. % to about 5 wt. %. The composition generally has a pH of from about 9 to about 13 in some embodiments. Advantageously, the inventive cleaning composition is effective in cleaning substrates such as semiconductor wafers while also avoiding, reducing, or eliminating roughness and/or corrosion. With respect to corrosiveness, it can be caused by faster oxidation and the subsequent tendency for an etchant to attack the most reactive metal sites, e.g., grain boundaries, which leads to high roughness on the surfaces of metal conductors.

Substrates Suitable for Cleaning

The cleaning composition of the invention has applicability with respect to a wide variety of semiconductor wafers used in fabrication of integrated circuits and other microdevices. Typically, the semiconductor wafer includes an insulator and a conducting agent. The cleaning composition of the invention can be used to clean substrates containing a variety of such insulators and conducting agents. For example, in some embodiments, copper can be a suitable conducting agent and silicon oxide (e.g., carbon doped) can be used as an insulator. Other layers can be included to include titanium nitride, tantalum nitride, or reactive metal, such as cobalt metal, in order to enhance the interface between copper and, e.g., material having a relatively low dielectric constant relative to silicon dioxide, or other materials. It will be understood that the layers can be applied by any suitable method, such as chemical vapor deposition (CVD). Following CMP, the use of the inventive cleaning composition desirably enhances conductivity by removing contaminants that would otherwise interfere with and hamper conductivity.

The semiconductor wafers can be of conventional node configuration in some embodiments, e.g., technology nodes of 65 nm or less, 45 nm or less, 32 nm or less, etc. However, in some embodiments, the inventive cleaning composition is particularly suited for advanced node applications (e.g., technology nodes of 28 nm or less, 22 nm or less, 18 nm or less, 16 nm or less, 14 nm or less, etc.). It will be understood that, as node technology becomes more advanced, the absence of roughness and/or corrosion following CMP becomes more important because the effects of roughness and corrosion have an increased negative impact on conductivity as the relative size of features on the wafer gets smaller.

Because of the significant advancement over the art that the inventive cleaning composition represents as compared with conventional cleaning compositions, the level of roughness and/or corrosion is reduced and more advanced node polishing can be achieved with better performance properties. For example, use of the inventive cleaning composition can allow enhanced conductivity on the semiconductor wafer in accordance with embodiments of the invention. It will be understood that roughness is the distance between the highest point and the lowest point on the surface, usually measured in angstroms (Å). In some embodiments, use of the cleaning composition of the invention can result in a roughness of about 3 Å or less, e.g., about 2 Å or less, about 1 Å or less, etc. However, as noted, the cleaning composition of the invention is not limited to use with advanced node wafers and can be used to polish other workpieces as desired. By way of comparison, a conventional node wafer may be able to tolerate higher roughness values (e.g., 6-7 Å) and such roughness can be achieved in accordance with some embodiments.

The cleaning composition of the invention can be used to clean a workpiece, such as a semiconductor wafer, containing a variety of materials, characterized by any suitable dielectric constant relative to silicon dioxide. In some embodiments, at least a portion of the workpiece can include materials that can exhibit a relatively low dielectric constant relative to silicon dioxide, such as a low dielectric constant of about 3.5 or less (e.g., about 3 or less, about 2.5 or less, about 2 or less, about 1.5 or less, or about 1 or less). Such materials can include, for example, organic polymer film as known in the art or nano-porous low-k dielectric films (e.g., various BLACK DIAMOND™ products, commercially available from Applied Materials, Inc., Santa Clara, Calif.).

Alternatively, or in addition, at least a portion of the workpiece can include a material that can have a dielectric constant of about 1 or more (e.g., about 1.5 or more, about 2 or more, about 2.5 or more, about 3 or more, or about 3.5 or more), such as nano-porous film or organic polymer film. Thus, the workpiece can contain material having a dielectric constant bounded by any two of the foregoing endpoints. For example, the workpiece can contain a material having a dielectric constant between about 1 and about 3.5 (e.g., between about 2 and about 3, between about 2 and about 3.5, between about 2.5 and about 3, between about 2.5 and about 3.5).

Cleaning Composition pH

The cleaning composition of the invention generally has a pH of at least about 9 (e.g., from about 9 to about 13). In preferred embodiments, the pH of the cleaning composition is at least about 10, such as from about 10 to about 13. While not wishing to be bound by any particular theory, such high pH's are believed to be desirable to, e.g., facilitate dissolution of organic compounds, such as BTA, and metal-organic compound adducts, such as Cu-BTA adducts. High pH's also beneficially can facilitate metal oxidation, such as in the case of copper to form copper I and copper II oxides. It is also believed that the high pH imparts a negative charge on the wafer surface (including the conducting agent and insulator) and on abrasive particles, causing them to repel each other. A negative surface charge increases the hydrophilicity of the wafer surface thereby preventing reprecipitation of organic-containing (e.g., BTA) by-products on the insulator surface.

In some embodiments, a thin layer of inhibiting copper I oxide is initially desirable in order to protect the conducting wafer from further deeper oxidation (e.g., dendrite formation, pitting etc.) after the post-CMP process. Further oxidation of copper I oxide during post-CMP process at high pH leads to copper II oxide, which is etched out for better cleaning.

Ratio of Bulky Protecting Ligand to Organic Amine

Surprisingly and unexpectedly, it has been found that the weight ratio of the bulky protecting ligand, such as a quaternary ammonium hydroxide, to the organic amine, which can act as a small sized etchant in some embodiments, contributes to a reduced degree of final roughness and/or corrosion of the CMP processed surface of a semiconductor wafer. While not wishing to be bound by any particular theory, it is believed that the bulky protecting ligand reacts faster with highly reactive sites on the semiconductor wafer, such as those with either high surface or low crystal lattice energies, than the organic amine because of the higher equilibrium concentration of the protecting ligand. The equilibrium concentration will be understood to refer to concentration of a product or reactant when the reaction is at chemical equilibrium. The higher concentration of the protecting ligand in some embodiments is useful because it forces more ligands to react with a metal surface.

In some embodiments, the cleaning composition comprises a higher concentration of the bulky protecting ligand relative to the organic amine to provide more uniform metal (e.g., copper) removal. The size of the protecting ligand as well as its concentration and the lability of its complexes with metal (e.g., copper) ions provide the metal (e.g., copper) removal rate and the uniformity of the etching process. Use of the organic amine in smaller doses is believed to be useful to allow the organic amine, which can serve as an etchant, to penetrate between bulky molecules of a protecting ligand on the metal surface. Desirably, in some embodiments, the labile nature of the bulky protecting ligand is advantageous in allowing the ligand to be recirculated in the system and also to be removed from the system, e.g., by rinsing. The lower amount of organic amine is also advantageous because it has been found to be one of the most corrosive ingredients in the cleaning composition.

Therefore, the bulky protecting ligand, such as a quaternary ammonium hydroxide, and the organic amine are provided in a desired ratio relative to each other in order to achieve high cleaning efficiency and also low metal (e.g., copper) roughness and/or corrosion. The weight ratio of the bulky protecting ligand, such as a quaternary ammonium hydroxide, to the organic amine is at least about 1:1 in some embodiments. For example, in some embodiments, the invention provides a relatively high concentration of the bulky protecting ligand and a relatively low concentration of the organic amine. In some embodiments of the invention, the inventive cleaning composition does not include a higher amount of the organic amine as compared with the bulkier protecting ligand.

Thus, in preferred embodiments, the weight ratio of the bulky protecting ligand, such as a quaternary ammonium hydroxide, to the organic amine is from about 1:1 to about 20:1, e.g., from about 1:1 to about 15:1, from about 1:1 to about 10:1, from about 1:1 to about 9:1, from about 1:1 to about 8:1, from about 1:1 to about 7:1, from about 1:1 to about 6:1, from about 1:1 to about 5:1, from about 1:1 to about 4:1, from about 1:1 to about 3.5:1, from about 1:1 to about 3:1, from about 1:1 to about 2.5:1, from about 1:1 to about 2.25:1, from about 1:1 to about 2:1, from about 1:1 to about 1.75:1, from about 1:1 to about 1.5:1, from about 1:1 to about 1.25:1, at least about 2:1, from about 2:1 to about 20:1, from about 2:1 to about 15:1, from about 2:1 to about 10:1, from about 2:1 to about 9:1, from about 2:1 to about 8:1, from about 2:1 to about 7:1, from about 2:1 to about 6:1, from about 2:1 to about 5:1, from about 2:1 to about 4:1, from about 2:1 to about 3.5:1, from about 2:1 to about 3:1, from about 2:1 to about 2.5:1, or from about 2:1 to about 2.25:1.

Bulky Protecting Ligand

Any suitable bulky protecting ligand can be used in preferred embodiments so long as it is able to readily form complexes with metal ions, such as copper ions. Suitable examples can include, for example, maleic acid, ethylenediaminetetraacetic acid (EDTA), NTA, HEDA, ethylenediaminetetramethylene phosphoric acid, ATMP, HIDA, DPTA, cysteine (Cys), Asc, carbohydrazide (CHZ), choline hydroxide, and/or quaternary ammonium hydroxide.

In some embodiments, any one or more suitable quaternary ammonium hydroxide can be used alone or in combination with other bulky protecting ligands. For example, quaternary ammonium hydroxides in accordance with some embodiments desirably generate low final metal surface roughness and/or effectively remove contaminants, including remnants of the polishing composition, such as silica or alumina abrasive particles or the like, metal ions from the polishing composition and from the material being polished, polishing pad debris, CMP-byproducts, surfactants, and other residues, e.g., organic residues such as BTA. In some embodiments, the quaternary ammonium hydroxide has Formula I below:

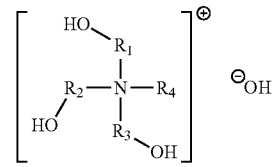

Formula I where each of $R_1$, $R_2$, $R_3$, and $R_4$ is independently an alkyl, which may be substituted or unsubstituted. As used herein throughout, the term "alkyl" means a straight-chain or branched alkyl substituent containing from, for example, 1 to about 20 carbon atoms, 1 to about 10 carbon atoms, 1 to about 6 carbon atoms, 1 to about 4 carbon atoms, or 1 to about 2 carbon atoms. Examples of such substituents include methyl, ethyl, propyl, isopropyl, n-butyl, sec-butyl, isobutyl, tert-butyl, pentyl, isoamyl, hexyl, and the like. As used herein and throughout, it will be understood that the term "alkyl" can be unsubstituted or can include substituents that can be substituted in some embodiments with, for example, halo, amino, alkylamino, dialkylamino, alkoxy, aryloxy, or hydroxy.

In some embodiments of the invention, the quaternary ammonium hydroxide comprises ammonium hydroxide, tetraalkylammonium hydroxide, hydroxyalkylammonium hydroxide, trihydroxyalkylammonium hydroxide, or any combination thereof. In other embodiments, the quaternary ammonium hydroxide comprises tetraethylammonium hydroxide (TEAM), tetrabutylammonium hydroxide (TBAH), cetyltrimetylammonium hydroxide, choline hydroxide, trihydroxyethylmethylammonium hydroxide (also known as tris(2-hydroxyethyl)methylammonium hydroxide or THEMAH), or any combination thereof. THEMAH is desirable in some embodiments because it is a readily available raw material and has been found to have chelating properties. The source of the bulky protecting ligand can be in the form of a cation, such as a bulky ligand cation, e.g., a quaternary ammonium cation (such as THEMA+), in some embodiments, where the cation serves to interact with the most reactive sites of conducting agent. The cation typically stays in solution. A counterion, such as hydroxide (—OH) can thus also be present in some embodiments, which can be useful for elevating pH and hydrophilic surface modification. Furthermore, the cation can include functional groups, e.g., —OH groups, that can interact to coordinate with, e.g., metal oxides formed on the substrate.

The bulky protecting ligand, such as a quaternary ammonium hydroxide, can be present in any suitable amount. For example, the bulky protecting ligand can be present in an amount effective to generate low final metal surface roughness and/or effectively remove contaminants, such as abrasive particles, metal ions, and other residues as discussed herein. In some embodiments, the bulky protecting ligand can be present in an amount of from about 0.01 wt. % to about 15 wt. %, such as from about 0.2 wt. % to about 12 wt. %, e.g., from about 1 wt. % to about 10 wt. %, from about 2 wt. % to about 7 wt. %, or from about 3 wt. % to about 5 wt. %. It will be appreciated that in preferred embodiments, the precise amount of the bulky protecting ligand (and the organic amine for that matter) is tailored to be in keeping with the desired weight ratio of the quaternary ammonium hydroxide to the organic amine as described herein.

It will be understood that, generally, the actual quantity of one or more ingredient in the inventive cleaning composition (e.g., a bulky protecting ligand, such as a quaternary ammonium hydroxide, an organic amine, and/or an organic inhibitor) may vary depending on the degree of desired dilution or concentration. In this respect, in some embodiments, the cleaning composition can be packaged in the form of a concentrate where water can be later added to dilute the composition, such as at a point of use (e.g., by an end user), or the composition can be packaged in a diluted form with water already included. For example, in some embodiments, the concentrated forms of each ingredient and/or the composition as a whole can facilitate ease of shipping, distribution, and sale. However in other embodiments, each ingredient and/or the composition as a whole can be in a diluted form, e.g., to simplify end use. Thus, the weight ranges as described herein and throughout for the aforementioned ingredients can refer to either the diluted or concentrated ranges.

Accordingly, each ingredient, such as a bulky protecting ligand, e.g., a quaternary ammonium hydroxide, can be present in a diluted form that is suitable for end use or in a form that is concentrated and then diluted (e.g., 2 times, 5 times, 10 times, 25 times, 40 times, 50 times, 60 times, 70 times, 100 times, 125 times, 150 times, 175 times, 200 times, etc. to the diluted form). When the concentrate is diluted with an equal volume of water (e.g., 1 equal volumes water, 4 equal volumes of water, 9 equal volumes of water, 24 equal volumes of water, 39 equal volumes of water, 49 equal volumes of water, 59 equal volumes water, 69 equal volumes of water, 99 equal volumes of water, 124 equal volumes of water, 149 equal volumes of water, 174 equal volumes of water, or 199 equal volumes of water, respectively), each ingredient will be present in the cleaning composition in an amount within the diluted ranges set forth below for each component. Furthermore, as will be understood by those of ordinary skill in the art, the concentrate can contain an appropriate fraction of the water present in the final cleaning composition in order to ensure that the compound or compounds that increases the generation of low final metal surface roughness, corrosion, and/or the effective removal of contaminants, such as abrasive particles, metal ions, and other residues as discussed herein are at least partially or fully dissolved in the concentrate.

In some embodiments, the bulky protecting ligand, such as a quaternary ammonium hydroxide, is present in the concentrated form in an amount that is at least about 3 wt. % of the weight of the cleaning composition, such as at least about 3.5 wt. %, at least about 4 wt. %, at least about 4.5 wt. %, at least about 5 wt. %, at least about 5.5 wt. %, at least about 6 wt. %, at least about 6.5 wt. %, at least about 7 wt. %, at least about 8 wt. %, at least about 9 wt. %, at least about 10 wt. %, at least about 12 wt. %, at least about 15 wt. %, at least about 17 wt. %, or at least about 20 wt. % (e.g., in a 200× concentrated solution). Each of the aforementioned endpoints can have an upper limit, e.g., up to about 3.5 wt. %, up to about 4 wt. %, up to about 4.5 wt. %, up to about 5 wt. %, up to about 5.5 wt. %, up to about 6 wt. %, up to about 6.5 wt. %, up to about 7 wt. %, up to about 7.5 wt. %, up to about 8 wt. %, up to about 8.5 wt. %, up to about 9 wt. %, up to about 9.5 wt. %, up to about 10 wt. %, up to about 11 wt. %, up to about 12 wt. %, up to about 13 wt. %, up to about 14 wt. %, up to about 15 wt. %, or up to about 20 wt. % as numerically appropriate.

In other embodiments, the bulky protecting ligand, such as a quaternary ammonium hydroxide, is present in a diluted form in an amount of from about 0.01 wt. % to about 0.2 wt. %, e.g., from about 0.01 wt. % to about 0.15 wt. %, from about 0.01 wt. % to about 0.12 wt. %, from about 0.01 wt. % to about 0.1 wt. %, from about 0.01 wt. % to about 0.05 wt. %, from about 0.02 wt. % to about 0.2 wt. %, from about 0.02 wt. % to about 0.15 wt. %, from about 0.02 wt. % to about 0.12 wt. %, from about 0.02 wt. % to about 0.1 wt. %, from about 0.02 wt. % to about 0.05 wt. %, from about 0.03 wt. % to about 0.2 wt. %, from about 0.03 wt. % to about 0.15 wt. %, from about 0.03 wt. % to about 0.12 wt. %, from about 0.03 wt. % to about 0.1 wt. %, from about 0.03 wt. % to about 0.05 wt. %, from about 0.04 wt. % to about 0.2 wt. %, from about 0.05 wt. % to about 0.15 wt. %, from about 0.05 wt. % to about 0.12 wt. %, from about 0.05 wt. % to about 0.1 wt. %, or from about 0.04 wt. % to about 0.05 wt. %.

Organic Amine

Any suitable organic amine can be used. In some embodiments, the organic amine is encompassed by Formula II below:

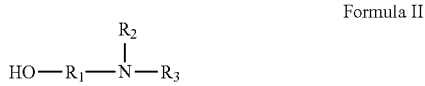

wherein $R_1$ is an unsubstituted or substituted alkyl, and each of $R_2$ and $R_3$ is independently H or R—OH, where R is an unsubstituted or substituted alkyl.

In some embodiments, the organic amine comprises alkylamine, dialkylamine, trialkylamine, alkanolamine, or any combination thereof. For example, the organic amine comprises methylamine, ethylamine, propylamine, isopropylamine, butylamine, dimethylamine, diethylamine, diisopropylamine, ethylmethylamine, butylmethylamine, propylethylamine trimethylamine, triethylamine, ethyldimethyllamine, tributylamine, monoethanolamine (MEA), diethanolamine (DEA), triethanolamine (TEA), 3-amino-1-propanol, 2-dimethylaminoethanol, tris(hydroxymethyl)aminomethane (Tris), or any combination thereof.

The organic amine can be present in any suitable amount. In some embodiments, the organic amine can be present in an amount of from about 0.005 wt. % to about 6 wt. %, such as from about 0.04 wt. % to about 5 wt. %, e.g., from about 0.08 wt. % to about 4 wt. %, from about 0.1 wt. % to about 3.5 wt. %, or from about 0.12 wt. % to about 3 wt. %. As noted above, in preferred embodiments, the precise amount of the organic amine is tailored to be in keeping with the desired weight ratio of the quaternary ammonium hydroxide to the organic amine as described herein.

In some embodiments, the organic amine is present in a concentrate form in an amount of from about 0.25 wt. % to about 6 wt. %, e.g., from about 0.25 wt. % to about 5 wt. %, from about 0.25 wt. % to about 4 wt. %, from about 0.25 wt. % to about 3.5 wt. %, from about 0.25 wt. % to about 3 wt. %, from about 0.25 wt. % to about 2.5 wt. %, from about 0.25 wt. % to about 2 wt. %, from about 0.5 wt. % to about 6 wt. %, from about 0.5 wt. % to about 5 wt. %, from about 0.5 wt. % to about 4 wt. %, from about 0.5 wt. % to about 3.5 wt. %, from about 0.5 wt. % to about 3 wt. %, from about 0.5 wt. % to about 2.5 wt. %, from about 0.5 wt. % to about 2 wt. %, from about 1 wt. % to about 6 wt. %, from about 1 wt. % to about 5 wt. %, from about 1 wt. % to about 4 wt. %, from about 1 wt. % to about 3.5 wt. %, from about 1 wt. % to about 3 wt. %, from about 1 wt. % to about 2.5 wt. %, from about 1 wt. % to about 2 wt. %, from about 2 wt. % to about 6 wt. %, from about 2 wt. % to about 5 wt. %, from about 2 wt. % to about 4 wt. %, from about 2 wt. % to about 3.5 wt. %, from about 2 wt. % to about 3 wt. %, or from about 2 wt. % to about 2.5 wt. %.

In some embodiments, the organic amine is present in a diluted form in an amount of from about 0.005 wt. % to about 0.12 wt. %, e.g., from about 0.005 wt. % to about 0.1 wt. %, from about 0.005 wt. % to about 0.08 wt. %, from about 0.005 wt. % to about 0.06 wt. %, from about 0.005 wt. % to about 0.04 wt. %, from about 0.01 wt. % to about 0.12 wt. %, e.g., from about 0.01 wt. % to about 0.1 wt. %, from about 0.01 wt. % to about 0.08 wt. %, from about 0.01 wt. % to about 0.06 wt. %, from about 0.01 wt. % to about 0.04 wt. %, from about 0.02 wt. % to about 0.12 wt. %, e.g., from about 0.02 wt. % to about 0.1 wt. %, from about 0.02 wt. % to about 0.08 wt. %, from about 0.02 wt. % to about 0.06 wt. %, from about 0.02 wt. % to about 0.04 wt. %, from about 0.03 wt. % to about 0.12 wt. %, e.g., from about 0.03 wt. % to about 0.1 wt. %, from about 0.03 wt. % to about 0.08 wt. %, from about 0.03 wt. % to about 0.06 wt. %, or from about 0.03 wt. % to about 0.04 wt. %. In some embodiments an alkanolamine is preferable with the lowest concentrations of monoalkanolamines and dialkanolamines being more preferable, and concentrations lower or equal to 13.0 mmole/L being particularly preferable to generate low corrosion.

Organic Inhibitor

Any suitable organic inhibitor can be used. For example, organic inhibitors in accordance with some embodiments desirably improve anti-corrosiveness and/or scavenge active oxygen from transition metal surfaces. In some embodiments, the organic inhibitor is, alone or in combination, ascorbic acid (Asc), carbohydrazide (CHZ), or diethylhydroxylamine (DEHA) encompassed below by Formulas III-V, respectively:

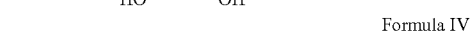

Alternatively or in addition, in some embodiments, the organic inhibitor comprises catechol, hydroquinone (HQn), hydroquinone monomethyl ether (MEHQ), dimethylglyoxime (DMGO), methylethylketoxime (MEKO), ammonium sulfite, or any combination thereof.

In some embodiments, a dual inhibitor is used. Dual inhibitors can be advantageous in some embodiments where one component serves as a chelating reducing agent for metal, such as copper, and the other component serves as an oxygen scavenger. Such combination is desirable in some embodiments because it provides higher cleaning performance and longer shelf-life for concentrated solutions. In some embodiments, the chelating reducing agent comprises CHZ, Asc, DMGO, Dihydroxybenzoic acid (DHBA), gallic acid, polyphenols, tannic acid, or any combination thereof. For example, in some embodiments, a combination of CHZ and DEHA is desired because it avoids or reduces the formation of byproducts during prolonged storage.

Any suitable dual inhibitor that includes a combination of a chelating reducing inhibitor with a non-chelating active oxygen scavenger can be used to improve anti-corrosiveness to, e.g., copper wiring and cobalt liner or the like, and the ability to remove abrasive grains and other residues in some embodiments. For example, the dual inhibitor can include, but is not limited to, CHZ/DEHA, Asc/DEHA, DMGO/DEHA, CHZ/MEKO, Asc/MEKO, DMGO/DEHA, CHZ/HQn, Asc/HQn, DMGO/HQn, CHZ/ammonium sulfite, Asc/ammonium sulfite, DMGO/ammonium sulfite, etc. In preferred embodiments, the dual inhibitor comprises CHZ and DEHA.

The organic inhibitor can be present in any suitable amount whether it is a sole inhibitor or in dual inhibitor form. In some embodiments, the organic inhibitor can be present in an amount of from about 0.002 wt. % to about 10 wt. %, such as from about 0.005 to about 5 wt. %, e.g., from about 0.2 wt. % to about 4 wt. %, from about 1 wt. % to about 3.5 wt. %, or from about 2 wt. % to about 3 wt. %. For example, in some embodiments, the organic inhibitor is in an amount of from about 0.002 wt. % to about 0.2 wt. % when in a diluted form. Additionally, in some embodiments, the organic inhibitor is in an amount of from about 0.1 wt. % to about 10 wt. % when in a concentrated form.

To illustrate, in some embodiments with the dual inhibitor comprising CHZ and DEHA, CHZ is present in a diluted form in an amount that is from about 0.002 wt. % to about 0.12 wt. %, e.g., from about 0.002 wt. % to about 0.1 wt. %, from about 0.002 wt. % to about 0.08 wt. %, from about 0.002 wt. % to about 0.06 wt. %, from about 0.002 wt. % to about 0.04 wt. %, from about 0.002 wt. % to about 0.03 wt. %, from about 0.005 wt. % to about 0.12 wt. %, from about 0.005 wt. % to about 0.1 wt. %, from about 0.005 wt. % to about 0.08 wt. %, from about 0.005 wt. % to about 0.06 wt. %, from about 0.005 wt. % to about 0.04 wt. %, from about 0.005 wt. % to about 0.03 wt. %, from about 0.01 wt. % to about 0.12 wt. %, from about 0.01 wt. % to about 0.1 wt. %, from about 0.01 wt. % to about 0.08 wt. %, from about 0.01 wt. % to about 0.06 wt. %, from about 0.01 wt. % to about 0.04 wt. %, or from about 0.01 wt. % to about 0.03 wt. %. In some embodiments with the dual inhibitor comprising CHZ and DEHA, DEHA is present in a diluted form in an amount that is from about 0.002 wt. % to about 0.06 wt. %, e.g., from about 0.002 wt. % to about 0.04 wt. %, from about 0.002 wt. % to about 0.03 wt. %, from about 0.002 wt. % to about 0.02 wt. %, from about 0.002 wt. % to about 0.01 wt. %, or from about 0.002 wt. % to about 0.005 wt. %. The other examples of suitable organic inhibitors whether alone or in dual form can be included in the same amounts as illustrated for the combination of CHZ and DEHA.

Water

The inventive cleaning composition contains water, which can be present in any suitable amount. For example, water can be present in the cleaning composition, as used to clean a substrate, in an amount of from about 99.5 wt. % to about 99.981 wt. %, e.g., from about 99.55 wt. % to about 99.981 wt. %, from about 99.6 wt. % to about 99.981 wt. %, from about 99.65 wt. % to about 99.981 wt. %, from about 99.7 wt. % to about 99.981 wt. %, from about 99.75 wt. % to about 99.981 wt. %, from about 99.8 wt. % to about 99.981 wt. %, from about 99.85 wt. % to about 99.981 wt. %, from about 99.9 wt. % to about 99.981 wt. %, from about 99.95 wt. % to about 99.981 wt. %, from about 99.98 wt. % to about 99.981 wt. %, from about 99.5 wt. % to about 99.98 wt. %, from about 99.55 wt. % to about 99.98 wt. %, from about 99.6 wt. % to about 99.98 wt. %, from about 99.65 wt. % to about 99.98 wt. %, from about 99.7 wt. % to about 99.98 wt. %, from about 99.75 wt. % to about 99.98 wt. %, from about 99.8 wt. % to about 99.98 wt. %, from about 99.85 wt. % to about 99.98 wt. %, from about 99.9 wt. % to about 99.98 wt. %, from about 99.95 wt. % to about 99.98 wt. %, from about 99.5 wt. % to about 99.95 wt. %, from about 99.55 wt. % to about 99.95 wt. %, from about 99.6 wt. % to about 99.95 wt. %, from about 99.65 wt. % to about 99.95 wt. %, from about 99.7 wt. % to about 99.95 wt. %, from about 99.75 wt. % to about 99.95 wt. %, from about 99.8 wt. % to about 99.95 wt. %, from about 99.85 wt. % to about 99.95 wt. %, from about 99.9 wt. % to about 99.95 wt. %, from about 99.5 wt. % to about 99.9 wt. %, from about 99.55 wt. % to about 99.9 wt. %, from about 99.6 wt. % to about 99.9 wt. %, from about 99.65 wt. % to about 99.9 wt. %, from about 99.7 wt. % to about 99.9 wt. %, from about 99.75 wt. % to about 99.9 wt. %, from about 99.8 wt. % to about 99.9 wt. %, from about 99.9 wt. %, from about 99.85 wt. % to about 99.9 wt. %, from about 99.5 wt. % to about 99.85 wt. %, from about 99.55 wt. % to about 99.85 wt. %, from about 99.6 wt. % to about 99.85 wt. %, from about 99.65 wt. % to about 99.85 wt. %, from about 99.7 wt. % to about 99.85 wt. %, from about 99.75 wt. % to about 99.85 wt. %, from about 99.8 wt. % to about 99.85 wt. %, from about 99.5 wt. % to about 99.8 wt. %, from about 99.55 wt. % to about 99.8 wt. %, from about 99.6 wt. % to about 99.8 wt. %, from about 99.65 wt. % to about 99.8 wt. %, from about 99.7 wt. % to about 99.8 wt. %, from about 99.75 wt. % to about 99.8 wt. %, from about 99.5 wt. % to about 99.75 wt. %, from about 99.55 wt. % to about 99.75 wt. %, from about 99.6 wt. % to about 99.75 wt. %, from about 99.65 wt. % to about 99.75 wt. %, from about 99.7 wt. % to about 99.75 wt. %, from about 99.5 wt. % to about 99.7 wt. %, from about 99.55 wt. % to about 99.7 wt. %, from about 99.6 wt. % to about 99.7 wt. %, from about 99.65 wt. % to about 99.7 wt. %, from about 99.5 wt. % to about 99.65 wt. %, from about 99.55 wt. % to about 99.65 wt. %, from about 99.6 wt. % to about 99.65 wt. %, from about 99.5 wt. % to about 99.6 wt. %, from about 99.55 wt. % to about 99.6 wt. %, or from about 99.5 wt. % to about 99.55 wt. %, all as based on the total weight of the cleaning composition.

In the concentrated form of the cleaning composition, some amount of water could be included in some embodiments of the inventive cleaning composition, such as in an amount of from about 45 wt. % to about 99 wt. %, e.g., from about 50 wt. % to about 95 wt. %, from about 60 wt. % to about 90 wt. %, from about 70 wt. % to about 85 wt. %, or from about 75 wt. % to about 80 wt. %.

Other Components

Cleaning compositions according to the invention can include wetting agents, such as surfactants, as desired, e.g., nonionic surfactants, anionic surfactants, amino acid based surfactants, etc. In some embodiments, the wetting agent can be 1,4-butane glycol, propylene glycol, or isopropanol. Specific examples of wetting agents include TRITON™ BG-10 (commercially available from available from the Dow Chemical Company, Lisle, Ill.), Sinopol 1110 (commercially available from Sino-Japan Chemical Co., Ltd., Taiwan, ROC), Sinonate 1100HP (commercially available from Sino-Japan Chemical Co., Ltd.) PERLASTAN™ C (commercially available from Schill+Seilacher GmbH, Böblingen, Germany), and/or Serdolamine PPG 72 (commercially available from MSC, Jiangsu, ROC). Such wetting agents can be included in order to improve wettability on the insulator surface as well as to facilitate organic residue dissolution.

In some embodiments, the cleaning composition is preferably substantially free of some ingredients previously known in cleaning compositions, such as ascorbic acid and/or cysteine, which can be either difficult to remove by cleaning and/or unstable during storage, e.g., in highly basic solutions. In some embodiments, the cleaning composition can optionally be substantially free of other ingredients, such as citric acid and oxalic acid. As used herein, "substantially free" of such other ingredients means that the composition contains 0 wt. % based on the weight of the composition, or no such other hydraulic material, or an ineffective or immaterial amount of such other ingredients. An example of an ineffective amount is an amount below the threshold amount to achieve the intended purpose of using such ingredients, as one of ordinary skill in the art will appreciate. An immaterial amount may be, e.g., about 1 wt. % or less, about 0.5 wt. % or less, about 0.1 wt. % or less, or about 0.05 wt. % or less, based on the weight of the composition, depending on the ingredient, as one of ordinary skill in the art will appreciate.

Mechanism

Reference is now made to FIG. 1. While not wishing to be bound by any particular theory, representations 1-3 along the horizontal scheme are believed to illustrate a mechanism in accordance with embodiments of the invention. For comparison purposes, FIG. 1 also provides representations 1 and 4, along the vertical scheme, to illustrate a mechanism believed to be associated with conventional systems.

The starting point depicted by the representation 1 illustrates copper as a base metal on a semiconductor wafer. Grain boundaries (x), (y), and (z) of the metal are shown schematically in FIG. 1. With respect to grain boundaries, it will be understood that metals have a polycrystal structure where each crystal is in the form of a grain. It is believed that more pronounced grain boundaries between crystals lead to a higher level of roughness, which is undesirable because conductivity is negatively impacted. It will also be seen that metal oxide (copper oxide in this case) forms by peroxide oxidation during CMP process.

With reference to the horizontal scheme believed to depict a mechanism in accordance with embodiments of the present invention, an inventive cleaning composition is applied to the wafer such that the bulky protecting ligand contacts the surface and is believed to react primarily with the most reactive sites thermodynamically on the substrate. In this respect, it is believed that grain boundaries, where crystallinity is lower, can result in high surface energy due to the roughness associated with the grain boundaries. In preferred embodiments, the bulky protecting ligand has desirable reaction kinetics, which allow it to react at rates either equivalent to or faster than those of the etchant. However, it is possible that in some embodiments that the bulky protecting ligand can react at a slower rate than the etchant, but, in such embodiments, to compensate the bulky protecting ligand can be included in higher molar concentration and outnumber an etchant.

In accordance with embodiments of the invention, as seen in representation 2, it is believed that desired bulky protecting ligands contain functional groups (depicted as "F.G.") that will attract to the high surface energy of the grain boundaries. Desired functional groups are characterized by nucleophilicity, metal, e.g., copper, ion affinity, chelation power, lability, and size (volume). Desired nucleophilicity can be characterized, e.g., by the Swain-Scott equation, the Ritchie equation, or the Mayr-Patz equation; metal ion affinity can be characterized, e.g., by the hard and soft (Lewis) acids and bases (HSAB) theory; chelation power can be characterized, e.g., by equilibrium constant for the dissociation reaction of a metal complex with a ligand of interest; and lability can be characterized, e.g., by how easily metal-ligand bonds are broken. Examples thereof can include —OH, —OR, RNH—, $R_2N$—, $H_2NCH_2CH_2O$—, C=O, carboxylic groups, phosphonic acid groups, morpholine derivatives and/or piperazine derivatives.

The ligand is protecting because it interacts with metal ions, such as copper, on the conducting agent surface while replacing M-O (e.g., Cu—O) bonds with new M-ligand (e.g., Cu-ligand) bonds at the most reactive sites, such as grain boundaries, characterized by low crystallinity and/or elevated surface energy. The protecting ligand serves to prevent preferable attack of an etchant on the most reactive sites (e.g., grain boundaries, scratches etc.), such that the organic amine can then provide improved uniform etching, e.g., substantially uniform.

Representation 3 illustrates the metal surface after cleaning has taken place. As seen in representation 3, once the most reactive sites of a conducting agent are protected by the bulky protecting ligand, the organic amine (e.g., MEA) as the small chelating etchant (depicted as "A"), which is preferably included in equal or a lower concentration relative to the protecting ligand, is drawn to the substrate to etch the surface substantially uniformly. The term "[O] basic solution" refers to possible further oxidation of Cu(0) and copper I by molecular oxygen in high pH basic solution. It is believed that, generally, the number of reactive sites constitutes a very small area compared to the entire surface of the semiconductor wafer. The organic amine as the small chelating etchant is able to contact the conducting agent surface between the reactive sites or start displacing the labile ligand, which is believed to form a barrier for the organic amine. Undercutting of copper oxide layer is believed to occur by way of interacting with an etchant and dissolution of adducts of amine molecules with copper ions and/or mixed ligand adducts of an amine and protecting ligand molecules with copper ions due to uniform surface etching action without preferable attack of organic amine on the most reactive sites, such as grain boundaries and defects, such as scratches.

Generally, as seen in representation 3, preferred embodiments of the invention generate relatively low roughness (3 Å or fewer). By way of comparison, the vertical scheme resulting in representation 4 illustrates a mechanism believed to be associated with conventional systems. It will be understood that the term anisotropic etching refers to non-uniform etching of a conducting agent surface due to preferable attack on the most reactive sites, which leads to much higher surface roughness and poor cleaning performance. In general, the mechanism resulting in representation 4 is believed to generate a higher roughness (e.g., 6-8 Å) which can compromise wafer performance, particularly in advanced node applications.

Method of Cleaning

The invention also provides a cleaning method. The cleaning method comprises, consists of, or consists essentially of (a) providing a semiconductor wafer having contaminants resulting from chemical-mechanical polishing of the semiconductor wafer and (b) contacting the surface of the semiconductor wafer with a cleaning composition to remove at least some of the contaminants from the surface of the semiconductor wafer. As noted herein, the contaminants can include, for example, abrasive particles, organic residue, metal ions, pad debris and CMP-byproducts, or any combination thereof. The wafer can include a low-k dielectric material and/or metal conductors in various embodiments.

The invention further provides a method for polishing and cleaning the surface of a semiconductor wafer. The method comprises, consists of, or consists essentially of: (a) providing a polishing pad, a chemical-mechanical polishing composition, and a semiconductor wafer; (b) contacting the semiconductor wafer with the polishing pad and the polishing composition; (c) moving the polishing pad relative to a surface of the semiconductor wafer with the polishing composition therebetween to abrade the surface of the semiconductor wafer and thereby polish the surface of the wafer such that the polished surface of the wafer contains contaminants from the chemical-mechanical polishing composition; and (d) contacting the polished surface of the semiconductor wafer that contains contaminants with a cleaning composition as described herein to remove at least some of the contaminants from the polished surface of the semiconductor wafer.

Typically a chemical-mechanical polishing composition will be utilized in the polishing of a semiconductor wafer with a polishing pad, such that the inventive method of polishing and cleaning a semiconductor wafer further comprises providing a chemical-mechanical polishing composition between the polishing pad and the semiconductor wafer, contacting the semiconductor wafer with the polishing pad with the polishing composition therebetween, and moving the polishing pad relative to the semiconductor wafer with the polishing composition therebetween to abrade the semiconductor wafer and thereby polish the semiconductor wafer. The invention is not limited by the polishing composition, which can be any suitable polishing composition as known in the art. Additionally, the invention is not limited by the CMP apparatus and polishing pad used during polishing, which can be any suitable CMP apparatus and polishing pad, many of which are known in the art.

Generally, chemical-mechanical polishing apparatus comprises (a) a platen that rotates; (b) a polishing pad disposed on the platen; and (c) a carrier that holds a semiconductor wafer to be polished by contacting the rotating polishing pad. In some embodiments, the apparatus further comprises (d) means for delivering a chemical-mechanical polishing composition between the polishing pad and the semiconductor wafer. For example, in some embodiments, the means for delivering the chemical-mechanical polishing composition can include, for example, a pump and flow metering system.

The following examples further illustrate the invention but, of course, should not be construed as in any way limiting its scope.

EXAMPLE 1

This Example illustrates the use of cleaning compositions prepared in accordance with embodiments of the invention after chemical-mechanical polishing ("CMP") has taken place on a wafer substrate containing copper.

In particular, blanket wafers (i.e., without any patterns) containing copper were subjected to platen-2 ("P2") copper polishing as understood in the art using a polishing composition commercially available as C8902 from Cabot Microelectronics (Aurora, Ill.). A polishing pad commercially identified as D100/(20WX80P)/WIN (5558) available from Cabot Microelectronics was used after conditioning with a product commercially identified as I-PDA33A-3, Kinik Co., San Jose, Calif. Each blanket copper wafer was then subjected to platen-3 ("P3") barrier polishing as understood in the art using a polishing composition commercially available as B7002-1 from Cabot Microelectronics, having the following formulation: 1.0 wt. % hydrogen peroxide ($H_2O_2$) and 250 ppm of benzotriazole (BTA). A polishing pad commercially identified as H7000 available from Fujibo Group (Tokyo, Japan) was used after being conditioned with a product commercially identified as A82 (3M, St. Paul, Minn.).

Polishing was performed on a MIRRA™ CMP apparatus (Applied Materials, Inc., Santa Clara, Calif.) with standard polishing parameters.

Five cleaning compositions, designated Compositions 1A-1E, were prepared with different amounts of tris(2-hydroxyethyl)methylammonium hydroxide ("THEMAH"), monoethanolamine ("MEA"), and carbohydrazide ("CHZ") as recited in Table 1, along with deionized water.

TABLE 1

| Composition | THEMAH (wt. %) | MEA (wt. %) | CHZ (wt. %) |
|---|---|---|---|
| 1A | 3.5 | 6 | 1.5 |
| 1B | 2 | 4 | 1.5 |
| 1C | 5 | 4 | 1.5 |
| 1D | 2 | 2 | 1.5 |
| 1E | 5 | 2 | 1.5 |

Figure 2:
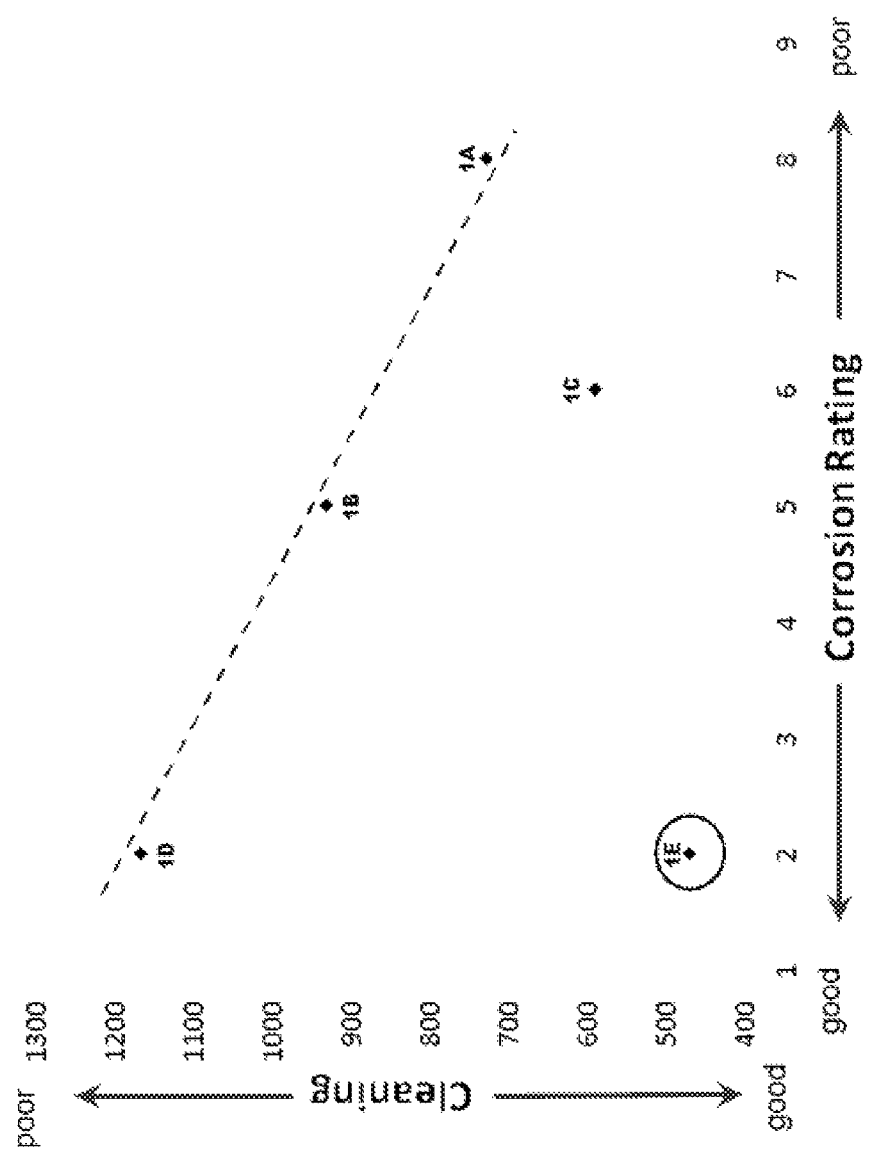
FIG. 2 is a graph plotting the level of cleaning (y-axis) vs. corrosion rating (x-axis) when five cleaning compositions are used to clean a substrate after chemical-mechanical polishing as set forth in Example 1.

Each of Compositions 1A-1E was used to clean the polished wafer substrates. Cleaning was performed with the help of an ONTRAK™ DSS200 Integra tool commercially available from Applied Materials, Inc. After cleaning, the wafer substrates were evaluated, with the results shown in Table 2 and FIG. 2. In particular, the number of defects on copper and BLACK DIAMOND™ ("BD-I") (commercially available from Applied Materials, Inc.) associated with each composition were determined based on observation of optical laser microscopy, using the Surfscan SP1$^{DLS}$ wafer inspection system and the KLARITY™ Defect analysis module (both commercially available from KLA Tencor, Milpitas, Calif.). Defects were measured with a threshold of 0.25 μm for copper and 0.225 μm for BD-I. FIG. 2 reflects the level of cleaning based on the combined total of copper and BD-I defects as represented by the "Total Defects" column in Table 2. The corrosion measurements are subjective, based on lab excessive etching test (20 min) with SEM visual rating, using a scale of 1-10, where 1 equals the best (DI water) and 10 equals the worst. Roughness is set forth as the arithmetic mean value (Ra).

TABLE 2

| Composition | Copper (Cu) Defects | BD Defects | Total Defects | Roughness (Å) | Corrosion Rating |
|---|---|---|---|---|---|
| 1A | 239 | 490 | 729 | 3.7 | 8 |
| 1B | 380 | 553 | 933 | 2.8 | 5 |
| 1C | 350 | 241 | 591 | 2.6 | 6 |
| 1D | 728 | 441 | 1169 | 2.8 | 2 |
| 1E | 302 | 171 | 473 | 2.4 | 2-3 |

Embodiments of the invention provide benefits with respect to the number of copper and/or BD-I defects; roughness; and/or corrosion rating. Preferably, embodiments of the invention provide good results in at least two of the aforesaid categories. The best results were observed when the cleaning composition contained a lower amount of an organic amine (MEA in this Example) than the amount of the protecting ligand in the form of a quaternary ammonium hydroxide (THEMAH in this Example); however, in some embodiments, equal amounts of both can be suitable.

As seen in Table 2 and FIG. 2, composition 1A had an undesirably high corrosion rating, high total defects, and high roughness value, while composition 1B, despite having a low roughness value, undesirably generated both high defects and a high corrosion rating. In contrast to composition 1B, composition 1C desirably realized low defects and a low roughness value despite a relatively high corrosion rating. Although composition 1D produced a high defect count, it desirably generated an exceptional corrosion rating and low roughness value. Composition 1E generated a high cleaning efficiency (low copper and BD-I defects) as well as low roughness and low corrosion.

EXAMPLE 2

This Example illustrates the benefit of using a cleaning composition prepared in accordance with embodiments of the invention in comparison with two conventional commercially available cleaning compositions after chemical-mechanical polishing ("CMP") has taken place on a wafer substrate containing copper.

In particular, blanket wafers containing copper and low dielectric organic film in the form of BD-I were subjected to platen-2 ("P2") and platen-3 ("P3") polishing as described in Example 1.

Polishing was performed on a MIRRA™ CMP apparatus with standard polishing parameters.

Table 3 below illustrates the results of the tested cleaning compositions. The number of copper defects and low dielectric organic film defects (BD-I) associated with each composition are noted based on observation of optical laser microscopy, using the Surfscan SP1$^{DLS}$ wafer inspection system and the KLARITY™ Defect analysis module. Defects were measured with a threshold of 0.25 µm for copper and 0.225 µm for BD-I. The corrosion measurements were subjective, based on lab excessive etching test (20 min) with SEM visual rating, using a scale of 1-10, where 1 equals the best and 10 equals the worst. The data for the number of defects in Table 3 is normalized to the number of defects observed for composition 2A, set to be 100.

TABLE 3

| Composition | Components | Defects Cu | Defects BD-I | Corrosion Rating | Roughness (Å) |
|---|---|---|---|---|---|
| 1E | THEMAH, MEA | 37 | 32 | 2 | 1.5-2.5 |
| 2A (Comparative) | TMAH, MEA (low concentration) | 100 | 100 | 1-2 | 2-3 |
| 2B (Comparative) | TMAH, MEA (high concentration) | 38 | 30 | 8-9 | 6-7 |

The inventive cleaning composition, composition 1E, was prepared in accordance with Example 1. Comparative compositions 2A and 2B are commercially available as PLAN-ARCLEAN™ and ESC-784™, respectively, both from ATMI (Danbury, Conn.).

As seen in Table 3, embodiments of the invention provide benefits with respect to the number of copper and/or low-k defects; roughness; and/or corrosion rating. Preferably, embodiments of the invention provide good results in at least two of the aforesaid categories. Composition 2A, while demonstrating a low roughness value and a low corrosion rating, undesirably generated high copper and low-k defects. Although composition 2B generated low total defects, it undesirably demonstrated a high roughness value and high corrosion rating. The inventive cleaning composition comprising a high concentration of a bulky protecting ligand in the form of THEMAH and a low concentration of an organic amine as a small chelating etchant (MEA in this instance) was shown to provide benefits with respect to all of the aforesaid categories. Specifically, composition 1E generated low copper and low-k defects as well as low roughness and low corrosion.

EXAMPLE 3

This Example illustrates the benefit of using a cleaning composition with dual inhibitor prepared in accordance with embodiments of the invention after CMP has been carried out on a wafer substrate containing copper.

In particular, blanket wafers containing copper were subjected to platen-2 ("P2") and platen-3 ("P3") polishing as described in Example 1.

Polishing was performed on a REFLEXION LK™ CMP apparatus (Applied Materials, Inc.) with standard polishing parameters.

Table 4 below illustrates the cleaning compositions prepared in accordance with embodiments of the invention, including the amounts of tris(2-hydroxyethyl)methylammonium hydroxide ("THEMAH"), monoethanolamine ("MEA"), diethylhydroxylamine ("DEHA"), and carbohydrazide ("CHZ") in the formulations. Each composition was diluted in-line by 50 times. Composition 1E was prepared in accordance with Example 1.

TABLE 4

| Composition | THEMAH (wt. %) | MEA (wt. %) | DEHA (wt. %) | CHZ (wt. %) |
|---|---|---|---|---|
| 1E | 5 | 2 | 0 | 1.5 |
| 3A | 5 | 2 | 0 | 0 |
| 3B | 5 | 2 | 3.0 | 0 |
| 3C | 5 | 2 | 1.5 | 1.5 |
| 3D | 5 | 2 | 0.5 | 1.5 |

Table 5 below illustrates the results of the tested cleaning compositions. Defects were measured by optical laser microscopy, using the Surfscan SP1$^{DLS}$ wafer inspection system and the KLARITY™ Defect analysis module with a threshold of 0.25 µm for copper and 0.225 µm for BD-I. The "Standard Deviation" represents the amount of variation that exists from the average; the "Particle" column refers to the number of abrasive particles not removed during the cleaning process; and the "Residue" column refers to the amount of organic material (including chemicals and pad debris) not removed during the cleaning process.

TABLE 5

| Composition | Type and Amount of Inhibitor | Defect Number DCO 0.25 µm | Standard Deviation | Particle | Residue |
|---|---|---|---|---|---|
| 1E | 1.5% CHZ only | 877 | 128 | 446 | 375 |
| 3A | None | 1170 | 126 | 654 | 451 |
| 3B | 3.0% DEHA only | 908 | 92 | 494 | 276 |
| 3C | 1.5% CHZ and 1.5% DEHA | 307 | 12 | 144 | 79 |
| 3D | 1.5% CHZ and 0.5% DEHA | 193 | 29 | 97 | 30 |

As seen in Table 5, composition 3D, which comprised a "dual inhibitor" (CHZ and DEHA), demonstrated significantly improved control of copper defects over compositions 1E-3B, which comprised no inhibitor, only CHZ, and only DEHA, respectively. In particular, composition 3A, which did not comprise inhibitors, demonstrated considerably high copper defects. Composition 3D, furthermore, showed a considerable reduction in both the number of abrasive particles and the amount of organic material remaining after post-CMP cleaning.

Table 6 below illustrates the positive effect of the dual inhibitor concentration CHZ/DEHA on anti-corrosiveness of copper wiring and cobalt liner. The corrosion potential (Ecorr) and corrosion current density (Icorr) for copper wiring and cobalt liner were measured by electrochemical analysis performed with SP300 with mercury standard electrode from (Bio-Logic Science Instruments, Claix, France).

TABLE 6

| Composition | Ecorr (mV) Co | Icorr (μA) Co | Ecorr (mV) Cu | Icorr (μA) Cu |
|---|---|---|---|---|
| 1E | −652 | 4.18 | −658 | 9.05 |
| 3A | −593 | 22.13 | −595 | 10.1 |
| 3B | −597 | 16.8 | −631 | 4.66 |
| 3D | −683 | 2.38 | −645 | 6.61 |

As seen in Table 6, the results illustrate positive effect of a dual inhibitor on chemical corrosion rates for both metals (cobalt liner and copper wire), such that Icorr is directly proportional to corrosion rate. Thus, advantageously, the smaller the Icorr, the slower corrosion occurs.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A composition for cleaning contaminants from semiconductor wafers following chemical-mechanical polishing, the composition comprising:
   (a) a bulky protecting ligand selected from maleic acid, ethylenediaminetetraacetic acid (EDTA), nitrilotriacetic acid (NTA), hydroxyethane diphosphoric acid (HEDA), ethylenediaminetetramethylene phosphoric acid, amino tris(methylene phosphoric acid) (ATMP), hydroxyethyliminodiacetic acid (HIDA), diethylenetriaminepentaacetic acid (DPTA), cysteine (Cys), ascorbic acid (Asc), choline hydroxide, quaternary ammonium hydroxide, and combinations thereof,
   (b) one or more organic amines,
   (c) one or more organic inhibitors, wherein the organic inhibitors are carbohydrazide (CHZ) and diethylhydroxylamine (DEHA), and
   (d) water,
wherein the one or more organic amines are present in an amount of from about 0.01 wt. % to about 5 wt. % based on the total weight of the composition, the weight ratio of the bulky protecting ligand(s) to the organic amine(s) is about 1:1 or higher, and the composition has a pH of from about 9 to about 13.

2. The composition of claim 1, wherein the contaminants include abrasive particles, organic residue, metal ions, polishing pad debris, CMP-byproducts, or any combination thereof.

3. The composition of claim 1, wherein the weight ratio of the bulky protecting ligand(s) to the organic amine(s) is from about 1:1 to about 10:1.

4. The composition of claim 3, wherein the weight ratio of the bulky protecting ligand(s) to the organic amine(s) is from about 1:1 to about 3:1.

5. The composition of claim 3, wherein the weight ratio of the bulky protecting ligand(s) to the organic amine(s) is about 2.5:1.

6. The composition of claim 1, wherein the bulky protecting ligand is a quaternary ammonium hydroxide having the formula:

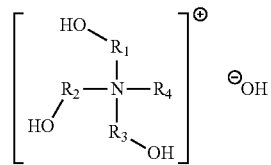

wherein each of $R_1$, $R_2$, $R_3$, and $R_4$ is independently an unsubstituted or substituted alkyl.

7. The composition of claim 5, wherein the bulky protecting ligand is a quaternary ammonium hydroxide comprising tetraalkylammonium hydroxide, hydroxyalkylammonium hydroxide, trihydroxyalkylammonium hydroxide, or any combination thereof.

8. The composition of claim 5, wherein the bulky protecting ligand is tetramethylammonium hydroxide (TMAH), tetraethylammonium hydroxide (TEAM), tetrabutylammonium hydroxide (TBAH), cetyltrimetylammonium hydroxide, choline hydroxide, tris(2-hydroxyethyl)methylammonium hydroxide (THEMAH), or any combination thereof.

9. The composition of claim 5, wherein the bulky protecting ligand is tris(2-hydroxyethyl)methylammonium hydroxide (THEMAH).

10. The composition of claim 1, wherein the bulky protecting ligand is present in an amount of at least about 3 wt. % based on the total weight of the composition.

11. The composition of claim 10, wherein the bulky protecting ligand is present in an amount of at least about 5 wt. % based on the total weight of the composition.

12. The composition of claim 1, wherein the organic amine has the formula:

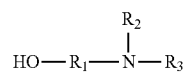

wherein $R_1$ is an unsubstituted or substituted alkyl, and each of $R_2$ and $R_3$ is independently H or R—OH, where R is an unsubstituted or substituted alkyl.

13. The composition of claim 1, wherein the organic amine is an alkylamine, dialkylamine, trialkylamine, alkanolamine, or a combination thereof.

14. The composition of claim 13, wherein the organic amine is methylamine, ethylamine, propylamine, isopropylamine, butylamine, dimethylamine, diethylamine, diisopropylamine, ethylmethylamine, butylmethylamine, propylethylamine, trimethylamine, triethylamine, ethyldimethyllamine, tributylamine, monoethanolamine (MEA), diethanolamine (DEA), triethanolamine (TEA), 3-amino-1-propanol, 2-dimethylaminoethanol, tris(hydroxymethyl)aminomethane (Tris), or a combination thereof.

15. The composition of claim 1, wherein:
(a) the bulky protecting ligand is trihydroxyethylmethylammonium tris(2-hydroxyethyl)methylammonium hydroxide (THEMAH) that is present in an amount of from about 0.01% to 0.2% by weight based on the total weight of the composition,
(b) the organic amine is monoethanolamine (MEA) that is present in an amount of from about 0.005% to 0.12% by weight based on the total weight of the composition,
(c) the organic inhibitor is (i) carbohydrazide (CHZ) that is present in an amount of from about 0.002% to 0.12% by weight based on the total weight of the composition and (ii) diethylhydroxylamine (DEHA) that is present in an amount of from about 0.002% to 0.06% by weight based on the total weight of the composition,
(d) water is present in an amount of from about 99.5 wt. % to about 99.98 wt. %; and
(e) the pH of the composition is from about 10 to about 13.

16. A composition for cleaning contaminants from semiconductor wafers following chemical-mechanical polishing, the composition comprising:
(a) a bulky protecting ligand selected from maleic acid, ethylenediaminetetraacetic acid (EDTA), nitrilotriacetic acid (NTA), hydroxyethane diphosphoric acid (HEDA), ethylenediaminetetramethylene phosphoric acid, amino tris(methylene phosphoric acid) (ATMP), hydroxyethyliminodiacetic acid (HIDA), diethylenetriaminepentaacetic acid (DPTA), cysteine (Cys), ascorbic acid (Asc), choline hydroxide, quaternary ammonium hydroxide, and combinations thereof,
(b) one or more organic amines, wherein the weight ratio of the bulky protecting ligand(s) to the organic amine(s) is from about 1:1 to about 10:1,
(c) one or more dual organic inhibitors, wherein the dual organic inhibitors are carbohydrazide (CHZ) and diethylhydroxylamine (DEHA), and
(d) water,
wherein the composition has a pH of from about 9 to about 13.

17. The composition of claim 16, wherein the chelating reducing agent is selected from CHZ, Asc, DMGO, Dihydroxybenzoic acid (DHBA), gallic acid, polyphenols, tannic acid and combinations thereof.

18. The composition of claim 16, wherein the oxygen scavenger is selected from DEHA, MEKO, HQn, ammonium sulfite and combinations thereof.

19. The composition of claim 16, wherein the contaminants include abrasive particles, organic residue, metal ions, pad debris, CMP-byproducts, or any combination thereof.

20. The composition of claim 16, wherein the weight ratio of the bulky protecting ligand(s) to the organic amine(s) is from about 1:1 to about 3:1.

21. The composition of claim 16, wherein the weight ratio of the bulky protecting ligand(s) to the organic amine(s) is about 2.5:1.

22. The composition of claim 16, wherein the bulky protecting ligand is a quaternary ammonium hydroxide having the formula:

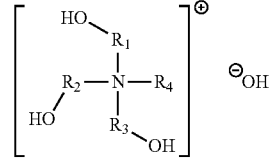

wherein each of $R_1$, $R_2$, $R_3$, and $R_4$ is independent an unsubstituted or substituted alkyl.

23. The composition of claim 22, wherein the bulky protecting ligand is ammonium hydroxide, tetraalkylammonium hydroxide, hydroxyalkylammonium hydroxide, trihydroxyalkylammonium hydroxide, or a combination thereof.

24. The composition of claim 23, wherein the bulky protecting ligand is tetramethylammonium hydroxide (TMAH), tetraethylammonium hydroxide (TEAM), tetrabutylammonium hydroxide (TBAH), cetyltrimetylammonium hydroxide, choline hydroxide, tris(2-hydroxyethyl)methylammonium hydroxide (THEMAH), or a combination thereof.

25. The composition of claim 23, wherein the bulky protecting ligand is tris(2-hydroxyethyl)methyl ammonium hydroxide (THEMAH).

26. The composition of claim 16, wherein the organic amine has the formula:

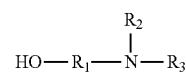

wherein $R_1$ is an unsubstituted or substituted alkyl, and each of $R_2$ and $R_3$ is independently H or R—OH, where R is an unsubstituted or substituted alkyl.

27. The composition of claim 16, wherein the organic amine is an alkylamine, dialkylamine, trialkylamine, alkanolamine, or a combination thereof.

28. The composition of claim 27, wherein the organic amine is methylamine, ethylamine, propylamine, isopropylamine, butylamine, dimethylamine, diethylamine, diisopropylamine, ethylmethylamine, butylmethylamine, propylethylamine trimethylamine, triethylamine, ethyldimethyllamine, tributylamine, monoethanolamine (MEA), diethanolamine (DEA), triethanolamine (TEA), 3-amino-1-propanol, 2-dimethylaminoethanol, tris(hydroxymethyl)aminomethane (Tris), or a combination thereof.

\* \* \* \* \*